March 27, 1962 W. A. KELLEY ET AL 3,027,455
ELECTRONIC CIRCUIT
Filed July 27, 1959
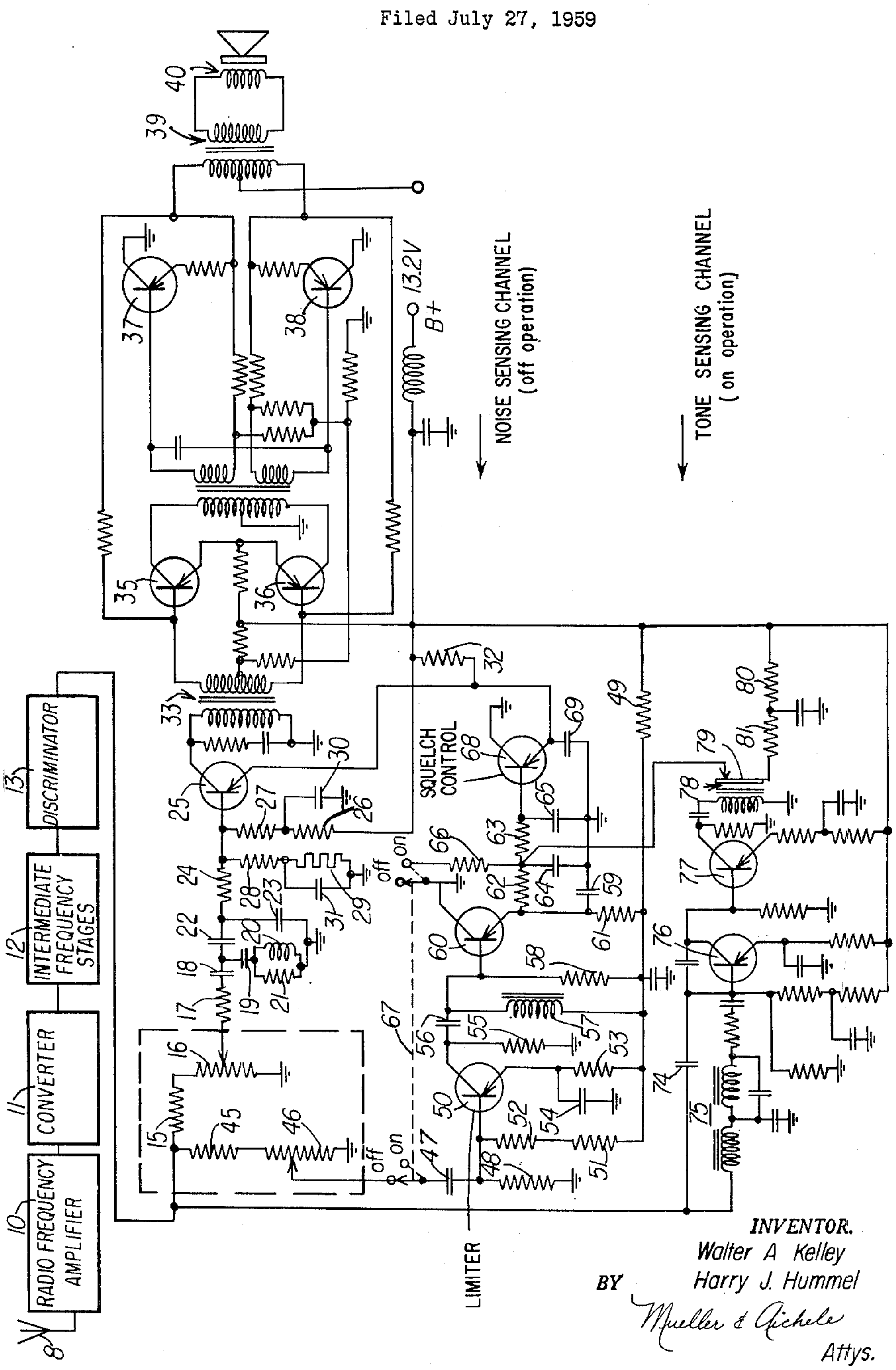
INVENTOR.
Walter A Kelley
Harry J. Hummel
BY Mueller & Aichele
Attys.

United States Patent Office 3,027,455
Patented Mar. 27, 1962

3,027,455
ELECTRONIC CIRCUIT

Walter A. Kelley, Glenview, and Harry J. Hummel, West Chicago, Ill., assignors to Motorola, Inc., Chicago, Ill., a corporation of Illinois Filed July 27, 1959, Ser. No. 829,596
14 Claims. (Cl. 250—20)

This invention relates generally to squelch circuits and more particularly to a transistor audio circuit which is cut off when no signal is being received to eliminate noise and which translates signals when the noise is reduced and/or when a particular tone is received.

It has been found essential in communication receivers to provide a squelch system for cutting off the audio output of the receiver in the absence of a carrier wave modulated by a signal to be received. Systems of this type are disclosed and claimed in Noble Patent No. 2,343,115, issued February 29, 1944, and Pawlowski Patent No. 2,808,507, issued October 1, 1957, both of which are assigned to the assignee of the present invention. In applying such squelch systems to receivers utilizing transistors a problem has been presented in providing control of a transistor audio amplifier so that it passes desired signals and is completely cut off when the desired signal is not received. This problem is particularly difficult when the transistors are energized from a source which varies in voltage through a wide range, such as in mobile applications wherein the receiver is energized from the automobile electrical system. Also, operation over wide ranges of temperature presents problems inasmuch as transistor characteristics change with temperature as well as with operating voltage. Because of this, the operating point of the squelch systems will tend to vary with different conditions of operation and this renders the system unsatisfactory.

It is also desired to provide a squelch system which will respond to the presence of a desired audio signal and which may also be operated in response to a control tone so that the audio system of only specified receivers will reproduce the transmissions. To provide a simple overall system the control should preferably be operated through the same components for both forms of operation.

It is therefore an object of the present invention to provide a highly reliable control circuit for controlling the translation through a transistor stage.

Another object is to provide an improved audio squelch system for use in a receiver having transistors operating directly from a low voltage source which varies in voltage during operation of the equipment.

A further object is to provide a simplified squelch system for use with speech signals which operates in response to noise to cut off the audio in the absence of speech signals and which also responds to control tones of predetermined frequencies to render the audio system selectively operable.

A still further object of the invention is to provide a control system for selectively cutting off a transistor amplifier wherein the operating point of the system is substantially independent of variations in supply voltage and in the ambient temperature to which the receiver is subjected.

A feature of the invention is the provision of a control system for a signal translating channel having a transistor serving as an amplifier, wherein the control voltage is developed and applied to a transistor serving as a switch, with the two transistors having their emitters connected so that when the switch transistor conducts a bias voltage is applied to the emitter of the audio transistor to cut off the same.

Another feature of the invention is the provision of a squelch control system for controlling a transistor audio stage in which the control voltage for the system varies with variations in the supply voltage and the bias circuit of the controlled audio stages includes a voltage sensitive resistor for changing the bias for the transistor with the supply voltage to compensate for changes in the control voltage.

A further feature of the invention is the provision of a transistorized noise or carrier squelch system including a switching transistor stage which responds to a small change in a relatively large control signal, with amplifier and rectifier circuits for providing a large control signal which reduces with the noise when a desired signal is received to provide very sensitive delayed squelch action.

A still further feature of the invention is the provision of a squelch system for transistor audio stages of communications receivers which include a switch transistor selectively rendered conducting by noise signals to cut off the audio stage when noise is received in the absence of speech signals, and which switch transistor is also controlled by a circuit responsive to a control tone so that the audio stage may be rendered operative in the presence of the control tone to thereby provide selective operation of predetermined receivers.

The invention is illustrated in the drawing wherein the single FIGURE is a schematic diagram of a receiver showing the detailed circuit of the audio amplifier and the control therefore.

In practicing the invention there is provided an audio control or squelch system which may be used with a radio receiver such as a frequency modulation communications receiver. The audio output is applied through a transistor audio amplifier to a reproducing device such as a loudspeaker. One of the audio amplifier stages, such as the first stage, may be controlled to cut off the supply of audio signals to the reproducing device. This is accomplished by applying the speech and noise signals to a limiting amplifier. The noise is selected at the output of the amplifier and rectified to provide a control voltage for operating a transistor which functions as a switch. The switch transistor operates in response to a small change in a relatively large control voltage. The switch transistor has its emitter directly connected to the emitter of the controlled transistor audio amplifier so that when the switch transistor conducts a control voltage is developed which cuts off the transistor audio amplifier. The control voltage varies with the supply voltage for the system and to hold the operating point substantially the same under all conditions the bias for the transistor audio amplifier is varied with the supply voltage. To accomplish this, the bias circuit includes a voltage sensitive resistor which adjusts the bias to compensate for variations in the supply voltage. A selective circuit responsive to a tone of a predetermined frequency is also provided so that the audio stage may be controlled from the transmitter. When such operation is desired the switching transistor is biased to normally conduct and thereby hold the audio stage cut off. The selective circuit reduces the forward bias to the switch transistor in response to the received tones to cut off the switch transistor so that the audio amplifier conducts and the signal is reproduced.

Referring now to the drawing, the controlled audio stage is illustrated in a frequency modulation communications receiver having an antenna 8, a radio frequency amplifier 10, and frequency converter 11. The receiver is of the superheterodyne type and may have one or more frequency conversion stages. The reduced frequency carrier wave is applied to the intermediate frequency stages 12 which includes selective circuits, amplifying stages and limiting stages. The intermediate frequency output is applied to discriminator 13 which derives the audio signals from the modulated carrier wave. Although the receiver is described as a frequency modulation receiver, it is obvious that receivers of other types can be used, and the system may be used in translating stages other than for radio receivers.

The audio output from the discriminator 13 is developed across resistor 15 and potentiometer 16, with a controlled portion of the audio signal being applied to the audio ampliqer. The signal is applied to transistor 25 through the high pass filter including resistor 17, capacitors 18 and 19, coil 20, resistor 21 and capacitors 22 and 23. The output of the filter is applied through resistor 24 to the base electrode of transistor 25. A bias potential is applied to the base electrode of transistor 25 through the voltage divider formed by resistors 26, 27, 28 and 29. Capacitors 30 and 31 provide bypass of high frequency signals about the resistors. The resistor 29 may be of the voltage sensitive type, the resistance of which varies inversely with the voltage applied thereacross. One element of this type which is commercially available is known as a "Varistor." The emitter of the transistor 25 is connected through resistor 32 to a source of positive potential and the collector is connected to an output circuit 31. The output circuit converts the single ended audio output into a push-pull output which is applied to the push-pull driver stage including transistors 35 and 36, and thence to the push-pull output stage including transistors 37 and 38. The audio output is applied through transformer 39 to loudspeaker 40.

For providing carrier squelch operation, the audio output is applied across resistor 45 and potentiometer 46, with a predetermined part of the audio signal being applied from potentiometer 46 to the squelch circuit. This signal is applied through capacitor 47 and across resistor 48 to the base electrode of transistor 50 which functions as an amplifier and limiter. Bias potential is applied to the base electrode through the voltage divider including resistors 51, 52 and 48. Bias is applied to the emitter electrode through resistor 53 with the emitter being bypassed by capacitor 54. The output is derived from the collector electrode and is developed across load resistor 55. Capacitor 56, inductor 57 and resistor 58 provide a high pass filter which passes only the noise signals at frequencies above the frequency of the speech signals utilized in the system. The noise signals are applied to the base of transistor 60 which functions as a rectifier to provide a control voltage in accordance with the noise applied thereto. The transistor 60 is connected in a common collector circuit with the collector electrode being grounded. The rectifier output is derived across load resistor 61 which is bypassed by capacitor 59 and is applied to integrating circuit including resistors 62 and 63 and capacitors 64 and 65, which smooth out the direct current voltage.

The direct current voltage is applied as a control voltage to the base electrode of the switch transistor 68, which is also connected in a common collector circuit with the collector grounded. The emitter is connected through resistor 32 to a bias potential source and is bypassed by capacitor 69. The emitter of transistor 68 is connected to the emitter of transistor 25 in the audio amplifier to control the conductivity of transistor 25 and thereby control the transmission of audio signals. The first audio amplifier stage 25 is controlled as audio signals are at the lowest level in this stage and the power required to provide the squelch action is a minimum.

Considering now the operation of the squelch system, as previously stated, the speech frequencies and noise will be applied to the amplifier 50 which serves to limit the signal therein when it reaches a predetermined value. When no speech signals are received, the noise signal only is applied to the transistor 50 and will be amplified therein. The amplified noise signal will pass through the filter including capacitor 56 and inductor 57 to transistor 60 which rectifies the noise and produces a control voltage. This is then applied to the base of switch transistor 68 to render this transistor conductive. When the transistor 68 conducts, the current drawn through resistor 32 will make the voltage at the emitter, as well as at the emitter of transistor 25, more negative. The base electrode of transistor 25 is biased so that this transistor normally conducts, but when the voltage on the emitter becomes more negative the transistor 25 will be cut off. Accordingly when noise alone is received the transistor 25 will be cut off so that the noise signals will not be reproduced.

When a carrier wave modulated by a speech signal is received, because of the carrier limiting characteristics and the captive effects of a frequency modulation receiver, the noise in the audio output of the discriminator will be reduced. As previously stated, the transistor 50 functions as a limiter and when speech signals are present the signal applied to transistor 50 will be at a higher level so that limiting action takes place. This will reduce the noise signals which accompany speech signals and which vary with signal strength. Accordingly the noise signals are reduced both in the receiver itself and by the transistor 50 when speech signals are received and the noise output of transistor 50 will be substantially reduced as compared to the condition when no speech signal is received. The noise signal will be selected by condenser 56 and inductor 57 and applied to transistor 60 which rectifies the same to provide a control voltage. However, because of the reduction of the noise signals the control voltage will be reduced and will not be sufficient to cause the transistor 68 to conduct. Accordingly transistor 68 will not provide switching action to cut off this transistor 25.

To make the squelch system highly sensitive, the transistor 50 operates at a high level to provide a relatively large output. The common collector rectifier circuit including transistor 60 also provides a large output so that the control signal applied to the base of transistor 68 is also large. A relatively large bias voltage is applied to the emitter electrode of transistor 68 so that this transistor does not conduct until a predetermined noise level is reached. This bias is obtained by applying a large bias voltage to the base electrode of transistor 25 so that the emitter of this transistor is at a correspondingly high voltage, and since this is connected to the emitter of transistor 68 it also is at a high voltage. In the system illustrated which operates from a voltage of around 13 volts, the base of transistor 25 may be held at about one half the supply voltage or 6 volts. The emitters of transistors 25 and 68 will then be at a voltage slightly higher than this when the transistor 25 conducts. Accordingly the transistor 68 will not conduct to provide switching action until the base voltage exceeds 6 volts. The change in voltage to provide switching action, however, is only about .2 volt so that the transistor will provide switching action on a change of voltage which is very small compared to the control voltage applied. This provides delay and makes for very sensitive squelch action.

It is desired that the operating point of the squelch circuit remain substantially constant in the presence of changes in the operating voltage and also in the presence of changes in temperature. The receiver may be used in a mobile communications system in which case the B+ supply is derived from the electrical system of an automobile. This voltage varies widely as the generator of the automobile is selectively rendered operative. Increase in the supply voltage causes an increase in gain of the amplifier so that an increased control voltage is provided. This is counteracted by selecting the resistor 29 in the bias circuit of transistor 25 to have a characteristic such that as the voltage across this resistor increases its resistance will decrease. This changes the bias on transistor 25 with change in supply voltage to compensate for the change in the control voltage applied to the emitter thereof. It is therefore possible to hold the operating point of the system at substantially the same point in the presence of changes in supply voltage.

To compensate for changes in the transistor operation with changes in temperature, the resistor 51 in the bias circuit for the limiter 50 may be a non-linear element such as a "Thermistor," the resistance of which varies inversely with temperature. Accordingly the resistance 51 will decrease with temperature to reduce the bias voltage applied to the transistor 50. This compensates for the increased conductivity of the transistor with temperature so that the system has substantially the same characteristics through a fairly wide range of temperatures.

As previously stated, it may be desired to control the audio amplifier in accordance with a control tone received so that a predetermined receiver or receivers will be selectively rendered operative under control of the transmitting station. To provide such operation switch 67 is moved to the "on" position to break the connection to the carrier squelch circuit. The audio output is applied to a selective system 75 which is designed to pass only low frequency control tones. The control tones selected by the network 75 are amplified in the amplifier stages including transistors 76 and 77. The output of the transistor 77 is applied to reed unit 78 which operates to intermittently close contact 79 thereof when a particular frequency is received. Some high frequency noise is applied through capacitor 74 so that the low frequency output of the transistor 77, which acts as a limiter, is reduced when noise only is received, and this reduces the possibility that reed 78 will respond to low frequency noise.

To provide control of the audio amplifier in response to operation of reed unit 78, the switch transistor 68 is used. The base of the transistor 68 is connected to ground through resistors 63 and 66 when the switch arm 67 is moved to the dotted position to control the bias voltage applied thereto. As the contact 79 closes, current is applied through resistors 80 and 81 to capacitor 64 to charge the same so that a control voltage is built up thereacross to cut off the transistor 68. This restores the bias on the emitter of transistor 25 to allow the same to conduct. When the contacts 79 are open the bias applied to the base of transistor 68 causes this transistor to conduct. Accordingly transistor 68 will normally conduct to cut off transistor 25, and when the contacts 79 intermittently close in response to a particular tone, the transistor 68 will be cut off and transistor 25 will conduct so that the received signal will be applied to the reproducer.

It is therefore seen that there is provided a highly effective transistorized squelch circuit which operates at the same desired point when subjected to varying conditions. The system is quite sensitive to provide effective squelch action. The circuit is particularly suited for mobile application in that it requires very little operating power and can be constructed as a compact rugged unit. Compensation is provided for the variations in voltage of mobile supplies and for changes in temperature under which the equipment must operate.

The circuit provides both carrier type squelch operation and tone selective operation through the same control transistor so that the circuit is simplified. The desired type of operation can be selected by a switch which is available to the operator of the equipment.

We claim:

1. An audio system for selectively translating audio signals and including voltage supply means and control voltage means energized thereby for producing a control voltage which varies with the voltage of the supply means, said system including in combination, a transistor having base, emitter and collector electrodes, means connected to said transistor to form an audio amplifier, means for applying the audio signals to the base electrode of said transistor, an output circuit connected to said collector electrode of said transistor, a bias circuit connected to the voltage supply means for applying a bias to said base electrode of said transistors, said bias circuit including resistor means having a resistance which changes with the voltage applied thereacross so that the bias applied to said base electrode changes in accordance with changes in the supply voltage, a control transistor having base, emitter and collector electrodes and connected in a common collector circuit, means coupled to the voltage control means for applying the control voltage to said base electrode of said control transistor, and means interconnecting said emitter electrodes of said transistors, whereby the control voltage renders said control transistor conductive to cause a voltage change at said emitter electrodes which renders said transistor of said audio amplifier nonconductive, and with the change in control voltage resulting from change in the supply voltage being offset by the change in base bias so that the cutoff action of said audio amplifier is substantially independent of supply voltage variations.

2. An audio system for selectively translating audio signals which includes speech signals and noise signals, and which system is cut off in response to noise signals in the absence of speech signals, said system including in combination, amplifier means including a first transistor, voltage supply means, means coupled to said transistor and to said voltage supply means applying a bias to said transistor so that limiting action takes place for signals which exceed a predetermined value, means for applying speech and noise signals to said amplifier, frequency selective means coupled to said amplifier means for passing noise signals at the output of said amplifier means having frequencies above that of the speech signals, rectifier means coupled to said frequency selective means for providing a direct current control voltage from the noise signals selected by said frequency selective means, a control circuit including a second transistor connected in a common collector circuit and having base, emitter and collector electrodes, means connecting said rectifier means to said base electrode of said second transistor for applying the direct current control voltage thereto, an audio amplifier including a third transistor having base, emitter and collector electrodes, means for applying the audio signals to the base electrode of said third transistor, an audio output circuit connected to said collector electrode of said third transistor, means coupled to said voltage supply means for applying a bias to said base electrode of said third transistor so that said bias changes according to changes in the supplied voltage, and means connecting said emitter electrode of said second transistor to said emitter electrode of said third transistor to provide a bias for said second and third transistors, said second transistor being rendered conductive in response to a direct current control voltage which overcomes the bias applied to said emitter electrode thereof, said second transistor when conductive rendering said third transistor nonconductive, with said second transistor responding to a change in the control voltage which is small with respect to the bias on the emitter electrode thereof.

3. An audio system for selectively translating audio signals from a source which includes speech signals and noise signals, and which system is cut off in response to noise signals in the absence of speech signals, said system including in combination, voltage supply means, amplifier means coupled to the source for amplifying speech and noise signals and for limiting signals which exceed a predetermined value, frequency selective means coupled to said amplifier means for passing noise signals at frequencies above that of the speech signals, rectifier means coupled to said frequency selective means for providing a direct current control voltage from the noise signals selected by said selective means, said amplifier means being energized from said voltage supply means so that the output thereof and said control voltage vary with the supply voltage for the system, a first transistor connected in a common collector circuit and having base, emitter and collector electrodes, means connecting said rectifier means to said base electrode for applying the direct current control voltage thereto, resistor means connected to said emitter electrode, an audio amplifier including a second transistor having base, emitter and collector electrodes, means for applying the audio signals from the source to the base electrode of said second transistor, and an audio output circuit connected to said collector electrode of said second transistor, means coupled to said voltage supply means for applying a bias to said base electrode of said second transistor so that said bias changes with change in supply voltage, and means connecting said emitter electrode of said second transistor to said emitter electrode of said first transistor, whereby noise signals in the absence of speech signals produce a direct current control voltage at said rectifier means for rendering said first transistor conductive to develop a voltage across said resistor means and thereby render said second transistor nonconductive, and with the variation in control voltage resulting from variation in the supply voltage being offset by the change of said bias so that the cutoff action of said second transistor is substantially independent of supply voltage variations.

4. An audio system for selectively translating audio signals from a source which includes speech signals and noise signals, and which system is cut off in response to noise signals in the absence of speech signals, said system including in combination, voltage supply means, amplifier means including a first transistor and means applying a bias thereto so that limiting action takes place for signals which exceed a predetermined value, said bias applying means including a resistor having a value which varies inversely with temperature for adjusting the bias on said transistor so that the action thereof remains substantially the same throughout a range of temperature, means for applying speech and noise signals from the source to said amplifier means, frequency selective means coupled to said amplifier means for passing noise signals at frequencies above that of the speech signals, rectifier means coupled to said frequency selective means for providing a direct current control voltage from the noise signals selected by said second selective means, said amplifier means being energized from said voltage supply means so that the output thereof and said control voltage vary with the supply voltage for the system, a control circuit including a second transistor connected in a common collector circuit and having base, emitter and collector electrodes, means connecting said rectifier means to said base electrode for applying the direct current control voltage thereto, resistor means connected to said emitter electrode and providing a bias therefor, a third transistor connected as an audio amplifier and having base, emitter and collector electrodes, means for applying the audio signals from the source to the base electrode of said third transistor, and an audio output circuit connected to said collector electrode of said third transistor, means coupled to said voltage supply means for applying a bias to said base electrode of said third transistor so that said bias changes with change in supply voltage, and means connecting said emitter electrode of said third transistor to said emitter electrode of said second transistor, whereby noise signals in the absence of speech signals produce a direct current control voltage at said rectifier means for rendering said second transistor conductive to develop a voltage across said resistor means and thereby render said third transistor nonconductive, and with the variation in control voltage resulting from variation in the supply voltage being offset by the change of said bias so that the cutoff action of said third transistor is substantially independent of supply voltage variations.

5. A system for selectively translating audio signals including in combination, supply voltage means for the system having a voltage which varies through a range of values, an audio amplifier including a transistor having base, emitter and collector electrodes, means for applying the audio signals to the base electrode of said transistor, an output circuit connected to said collector electrode of said transistor, means coupled to said supply voltage means for applying a bias to said base electrode of said transistor so that the bias changes with the voltage of said supply means, a control circuit including a transistor connected in a common collector circuit and having base, emitter and collector electrodes, circuit means connected to said base electrode of said control transistor and including frequency selective means and noise selective means, said frequency selective means and said noise selective means each providing a control voltage, said frequency selective means and said noise selective means being energized by said supply voltage means whereby said control voltages thereof vary with the voltage of said supply means, said circuit means being arranged to apply a control voltage from one of said selective means to said base electrode to selectively render said control transistor conductive, and means interconnecting said emitter electrodes of said transistors, whereby conduction of said control transistor causes a voltage change at said emitters to render said transistor of said audio amplifier nonconductive, the voltage at said emitter of said audio amplifier transistor varying with the voltage of said supply means, and such variation being offset by the change in base bias so that the cutoff action of said audio amplifier is substantially independent of supply voltage variations.

6. An audio system for selectively translating audio signals in response to a control voltage including in combination, an audio amplifier including a transistor having base, emitter and collector electrodes, means for applying the audio signals to the base electrode of said transistor, an output circuit connected to said collector electrode of said transistor, means connecting said base electrode of said transistor to a potential supply to provide a bias for said base electrode, resistor means connected to said emitter electrode of said transistor, a control circuit including a transistor connected in a common collector circuit and having base, emitter and collector electrodes, means connecting said emitter electrode of said control transistor to said emitter electrode of said transistor of said audio amplifier to provide a bias to said emitter electrode of said control transistor related to the bias applied to said base electrode of said transistor of said audio amplifier, circuit means connected to said base electrode of said control transistor including frequency selective means and noise selective means, each of said selective means being adapted to produce a control voltage, said circuit means including switch means arranged to apply a control voltage from one of said selective means is applied to said base electrode to selectively render said control transistor conductive, with said control transistor responding to a change in the control voltage which is small with respect to the control voltage, said control transistor when conductive producing a voltage across said resistor means to render said transistor of said audio amplifier nonconductive to squelch the audio signals.

7. An audio system for selectively translating audio signals from a source including in combination, first amplifier means coupled to the source and including a first transistor, voltage supply means, means coupled to said voltage supply means applying a bias to said transistor so that limiting action takes place for signals which exceed a predetermined value, said bias applying means including a resistor having a value which varies inversely with temperature for adjusting the bias on said transistor so that the action thereof remains substantially the same throughout a range of temperature, first frequency selective means coupled to said first amplifier means for passing noise signals at frequencies above that of the speech signals, rectifier means coupled to said first frequency selective means for providing a direct current control voltage from the noise signals selected by said first selective means, whereby noise signals in the absence of speech signals produce a direct current control voltage from said rectifier means which varies with the supply voltage for the system, a control circuit including a second transistor connected in a common collector circuit and having base, emitter and collector electrodes, means connecting said rectifier means to said base electrode for applying the direct current control voltage thereto, resistor means connected to said emitter electrode across which a voltage is developed when said second transistor conducts, second frequency selective means for passing lower frequencies in the audio frequency range, second amplifier means coupled to said second frequency selective means for amplifying the signal passed by said second frequency selective means, a bias circuit connected to said base electrode of said second transistor and including capacitor means, frequency selective relay means coupled to said second amplifier means and operated by the signal therefrom, said relay means including contact means connected to said capacitor means to develop a voltage thereacross when the particular frequency is reecived to increase the control voltage applied to said base electrode of said second transistor and thereby cut off said second transistor, a third transistor connected as an audio amplifier and having base, emitter and collector electrodes, means for applying the audio signals from the source to the base electrode of said third transistor, and an audio output circuit connected to said collector electrode of said third transistor, means coupled to said voltage supply means for applying a bias to said base electrode of said third transistor to render said third transistor conductive, with said bias changing with change in supply voltage, and means connecting said emitter electrode of said third transistor to said emitter electrode of said second transistor so that said voltage developed across said resistor means when said second transistor conducts renders said third transistor nonconductive, and with the variations in the control voltages resulting from variation in the supply voltage being offset by the change of said bias so that conduction of said third transistor is substantially independent of supply voltage variations.

8. An audio system for selectively translating audio signals from a source including in combination, first amplifier means including a first transistor voltage supply means, means coupled to said voltage supply means applying a bias to said first transistor so that limiting action takes place for signals which exceed a predetermined value, said bias applying means including a resistor having a value which varies inversely with temperature for adjusting the bias on said transistor so that the action thereof remains substantially the same throughout a range of temperature, means applying audio signals from the source to said first amplifier means, first frequency selective means coupled to said first amplifier means for passing noise signals at frequencies above that of desired audio signals, rectifier means coupled to said first frequency selective means for providing a direct current control voltage from the noise signals selected by said first selective means, whereby noise signals in the absence of desired signals produce a direct current control voltage from said rectifier means which varies with the supply voltage for the system, a control circuit including a second transistor connected in a common collector circuit and having base, emitter and collector electrodes, a bias circuit connected to said base electrode of said second transistor, means connecting said rectifier means to said bias circuit for applying the direct current control voltage thereto to render said second transistor conductive, resistor means connected to said emitter electrode across which a voltage is developed when said second transistor conducts, second frequency selective means for passing signals in the lower audio frequency range, second amplifier means coupled to said second frequency selective means for amplifying the signal passed by said second frequency selective means, frequency selective relay means coupled to said second amplifier means and operated by the signal therefrom, said relay means operating to increase the voltage in said bias circuit when the particular frequency is received to increase the voltage applied to said base electrode of said second transistor to cut off said second transistor, a third transistor connected as an audio amplifier and having base, emitter and collector electrodes, means for applying the audio signals from the source to the base electrode of said third transistor, and an audio output circuit connected to said collector electrode of said third transistor, means coupled to said voltage supply means for applying a bias to said base electrode of said third transistor to render said third transistor conductive, with said bias changing with change in supply voltage, and means connecting said emitter electrode of said third transistor to said emitter electrode of said second transistor so that said voltage developed across said resistor means when said second transistor conducts renders said third transistor nonconductive, and with the variations in the control voltages resulting from variation in the supply voltage being offset by the change of said bias so that conduction of said third transistor is substantially independent of supply voltage variations.

9. An audio system for selectively translating audio signals from a source including in combination, first amplifier means including a first transistor voltage supply means, means coupled to said voltage supply means applying a bias to said transistor so that limiting action takes place for signals which exceed a predetermined value, switch means including first and second contacts, said first contacts selectively applying signals from the source to said first amplifier means, first frequency selective means coupled to said amplifier means for passing noise signals at frequencies above that of desired audio signals, rectifier means coupled to said first frequency selective means for providing a direct current control voltage from the noise signals selected by said first selective means, whereby noise signals in the absence of desired signals produce a direct current control voltage from said rectifier means, a control circuit including a second transistor connected in a common collector circuit and having base, emitter and collector electrodes, a bias circuit connected to said base electrode of said second transistor and including said second contacts of said switch means, means connecting said rectifier means to said base electrode for applying the direct current control voltage thereto, resistor means connected to said emitter electrode across which a voltage is developed when said second transistor conducts, second frequency selective means for passing frequencies in the audio frequency range, second amplifier means coupled to said second frequency selective means for amplifying the signal passed by said second frequency selective means, frequency selective relay means coupled to said second amplifier means and operated by the signal therefrom, said bias circuit including capacitor means and resistor means selectively bridged across said capacitor means by said second contacts, means including said relay means to apply a potential to said capacitor means to charge the same when the particular frequency is received to increase the voltage applied to said base electrode of said second transistor and thereby cut off said second transistor, a third transistor connected as an audio amplifier and having base, emitter and collector electrodes, means for applying the audio signals from the source to the base electrode of said third transistor, and an audio output circuit connected to said collector electrode of said third transistor, means coupled to said voltage supply means for applying a bias to said base electrode of said third transistor to render said third transistor conductive, and means connecting said emitter electrode of said third transistor to said emitter electrode of said second transistor so that said voltage developed across said resistor means renders said third transistor nonconductive.

10. A system for selectively translating audio signals including in combination, an audio amplifier including a first transistor having base, emitter and collector electrodes, voltage supply means, bias means coupled to said voltage supply means and to said electrodes of said transistor for controlling the conduction thereof, means for applying the audio signals to the base electrode of said transistor, an output circuit connected to said collector electrode of said transistor, a control circuit including a second transistor connected in a common collector circuit and having base, emitter and collector electrodes, a bias circuit for said base electrode of said second transistor for holding the same conductive, means interconnecting said emitter electrodes of said transistors whereby conduction of said second transistor causes a voltage change at said emitter electrodes to render said first transistor nonconductive, frequency selective means for passing lower audio frequencies, means for applying audio signals to said frequency selective means, second amplifier means connected to said frequency selective means and energized by said voltage supply means to produce an output which varies with the frequency of the audio signal and with the voltage of said voltage supply means, frequency responsive relay means connected to said second amplifier means and providing intermittent contact closures in response to a particular frequency, means including said relay means connected to said bias circuit to increase the voltage applied to said base electrode of said second transistor to cut off the same and thereby render said first transistor conductive.

11. A system for selectively translating audio signals including in combination, an audio amplifier including a first transistor having a plurality of electrodes, voltage supply means, bias means coupled to said voltage supply means and to said electrodes of said transistor for controlling the conduction thereof, means for applying the audio signals to an electrode of said first transistor, an output circuit connected to another electrode of said first transistor, a control circuit including a second transistor having a plurality of electrodes, a bias circuit for said second transistor for holding the same conductive, means interconnecting electrodes of said transistors whereby conduction of said second transistor causes a voltage change at said connected electrodes to render said first transistor nonconductive, frequency selective means for passing lower audio frequencies, means for applying audio signals to said frequency selective means, second amplifier means connected to said frequency selective means, said second amplifier means including limiter means, said frequency selective means including a portion passing high frequency signals to reduce the lower audio frequency components at the output of said limiter in the presence of noise, frequency responsive relay means connected to said limiter means and providing intermittent contact closures in response to a particular frequency, means including said relay means connected to said bias circuit to increase the voltage applied to said second transistor to cut off the same and thereby render said first transistor conductive.

12. An audio system for selectively translating audio signals and including voltage supply means and control means energized thereby for producing a control voltage which varies with the supply voltage applied to the system, said system including in combination, a transistor having a plurality of electrodes and connected as an audio amplifier, an input circuit connected to said transistor for applying audio signals thereto, an output circuit connected to said transistor, a bias circuit connected to the voltage supply means for applying bias voltages to said electrodes of said transistor, said bias circuit including resistor means having a resistance which changes with the voltage applied thereacross so that the bias voltages change with the supply voltage, a control transistor having a plurality of electrodes, means for applying the control voltage to said control transistor, and means interconnecting electrodes of said transistors, whereby the control voltage selectively renders said control transistor conductive and causes a voltage change at the connected electrodes to render said transistor of said audio amplifier nonconductive, and with the change in control voltage resulting from change in the supply voltage being offset by the change in base bias so that the conduction action of said audio amplifier is substantially independent of supply voltage variations.

13. A system for selectively translating audio signals including in combination, an audio amplifier including a transistor having base, emitter and collector electrodes, means for applying the audio signals to the base electrode of said transistor, an output circuit connected to said collector electrode of said transistor, a control circuit including a transistor connected in a common collector circuit and having base, emitter and collector electrodes, means interconnecting said emitter electrodes of said transistors so that conduction of said control transistor causes a voltage change at said emitters to render said transistor of said audio amplifier nonconductive, circuit means connected to said base electrode of said control transistor and including carrier squelch means and tone squelch means, said carrier squelch means including amplifier means, means applying the audio signals to said amplifier means, first frequency selective means coupled to said amplifier means for passing noise signals at frequencies above the frequencies of speech signals, rectifier means coupled to said frequency selective means for providing a direct current control voltage from the selected noise signals, whereby noise signals in the absence of speech signals produce a direct current control voltage, means connecting said rectifier means to said base electrode of said control transistor for applying the direct current control voltage thereto to cause said control transistor to conduct and thereby cut off said transistor of said audio amplifier in response to noise signals, said tone squelch means including second frequency selective means for passing lower frequencies in the audio frequency range, means applying the audio signals to said second frequency selective means, bias circuit means connected to said base electrode of said second transistor to render the same conducting and thereby cut off said transistor of said audio amplifier, frequency selective relay means coupled to said second frequency selective means and operated by a tone signal of a particular frequency passed thereby, said relay means including contact means connected to said bias circuit means to develop a voltage therein when said relay operates to increase the control voltage applied to said base electrode of said second transistor and thereby cut off said second transistor, whereby said transistor of said audio amplifier is rendered conducting in response to a tone signal of the particular frequency.

14. A system for selectively translating audio signals including in combination, voltage supply means for the system having a voltage which varies through a range of values, an audio amplifier including a transistor having base, emitter and collector electrodes, means for applying the audio signals to the base electrode of said transistor, an output circuit connected to said collector electrode of said transistor, means coupled to said voltage supply means for applying a bias to said base electrode of said transistor so that the bias changes with the voltage of said supply means, a control circuit including a transistor connected in a common collector circuit and having base, emitter and collector electrodes, means interconnecting said emitter electrodes of said transistors so that conduction of said control transistor causes a voltage change at said emitters to render said transistor of said audio amplifier nonconductive, circuit means connected to said base electrode of said control transistor and including carrier squelch means and tone squelch means, said carrier squelch means including amplifier means energized by said voltage supply means, means applying the audio signals to said amplifier means, first frequency selective means coupled to said amplifier means for passing noise signals at frequencies above the frequencies of speech signals, rectifier means coupled to said frequency selective means for providing a direct current control voltage from the selected noise signals, whereby noise signals in the absence of speech signals produce a direct current control voltage which varies with the voltage of said voltage supply means, means connecting said rectifier means to said base electrode of said control transistor for applying the direct current control voltage thereto to cause said control transistor to conduct and thereby cut off said transistor of said audio amplifier in response to noise signals, said tone squelch means including second frequency selective means for passing lower frequencies in the audio frequency range, means applying the audio signals in said second frequency selective means, bias circuit means connected to said base electrode of said second transistor to render the same conducting and thereby cut off said transistor of said audio amplifier, frequency selective relay means coupled to said second frequency selective means and operated by a tone signal of a particular frequency passed thereby, said relay means including contact means connecting said voltage supply means to said bias circuit means to develop a voltage therein when said relay operates to increase the control voltage applied to said base electrode of said second transistor and thereby cut off said second transistor, whereby said transistor of said audio amplifier is rendered conducting in response to a tone signal of the particular frequency.

References Cited in the file of this patent

UNITED STATES PATENTS

| | | |
|---|---|---|
| 2,546,987 | Eannarino | Apr. 3, 1951 |
| 2,724,049 | Rouault | Nov. 15, 1955 |
| 2,743,361 | Bauman | Apr. 24, 1956 |
| 2,808,507 | Pawlowski | Oct. 1, 1957 |
| 2,915,603 | Jacobsen | Dec. 1, 1959 |
| 2,926,241 | Goldman | Feb. 23, 1960 |

FOREIGN PATENTS

| | | |
|---|---|---|
| 630,123 | Great Britain | July 9, 1946 |

OTHER REFERENCES

Article: FM Broadcasting and Communications, by Hemmes, in FM and Television, August 1945, pages 42 to 52, 76 and 78, of which only page 50 is relied on.